United States Patent [19]

Toyoda

[11] 4,398,268
[45] Aug. 9, 1983

[54] SEMICONDUCTOR INTEGRATED CIRCUIT DEVICE

[75] Inventor: Kazuhiro Toyoda, Yokohama, Japan
[73] Assignee: Fujitsu Limited, Kawasaki, Japan
[21] Appl. No.: 171,274
[22] Filed: Jul. 23, 1980

[30] Foreign Application Priority Data

Jul. 26, 1979 [JP] Japan .................................. 54-95346
Jul. 27, 1979 [JP] Japan .................................. 54-95697

[51] Int. Cl.³ ........................ G11C 7/00; G11C 11/40
[52] U.S. Cl. .................................... 365/190; 365/155
[58] Field of Search ................ 365/154, 156, 190, 155

[56] References Cited

U.S. PATENT DOCUMENTS

| 3,986,178 | 10/1976 | McElroy et al. | 365/155 |
| 4,078,261 | 3/1978 | Millhollan et al. | 365/189 |
| 4,122,542 | 10/1978 | Camerik et al. | 365/156 |
| 4,228,525 | 10/1980 | Kawarada et al. | 365/154 |
| 4,272,811 | 6/1981 | Wong | 365/190 |
| 4,302,823 | 11/1981 | Gersbach et al. | 365/190 |

OTHER PUBLICATIONS

Beranger et al., "Read and Write Circuits for a Harper Cell Memory", IBM Tech. Disc. Bull., vol. 21, No. 10, 3/79, pp. 4066–4067.
Kawarada et al., "A 4K-Bit Static I²L Memory", IEEE Transactions on Electron Devices, vol. ED-26, No. 6, 6/79, pp. 886–892.
Mayumi et al., IEEE Journal of Solid-State Circuits, "A25-ns Read Access Bipolar 1Kbit TTLRAM", vol. SC-9, No. 5, pp. 283–284, 10/74.

Primary Examiner—Stuart N. Hecker
Attorney, Agent, or Firm—Staas & Halsey

[57] ABSTRACT

An integrated injection logic (I²L) memory where sink currents flowing into non-selected memory cells are supplied from clamp circuits, not from the selected memory cell. In addition, the potential of the selected bit line through which a write current flows is decreased by the clamp circuits.

6 Claims, 14 Drawing Figures

| Fig. 6A | Fig. 6B |

SEMICONDUCTOR INTEGRATED CIRCUIT DEVICE

BACKGROUND OF THE INVENTION

The present invention relates to a semiconductor device and, more particularly, to a semiconductor integrated circuit device in which memory cells are of an I²L (which is an abbreviation for Integrated Injection Logic) type.

In general, each of the memory cells of a bipolar memory device comprises a pair of load transistors connected to one word line, and a pair of cross-coupled transistors, connected to the load transistors, to one hold line, and to a pair of bit lines, which serve as a flip-flop. In the bipolar memory cells, the resistance value of the load resistors is very large so as to reduce the power consumption thereof. Therefore, the area of the load resistors occupied in a chip is very large and, in addition, isolation between the cross-coupled transistors is required. Consequently, the bipolar memory cells are large in size, which results in low integration density and a consequently high manufacturing cost of the bipolar memory device.

In recent years, an I²L memory device has been developed. In an I²L memory cell, a pair of load transistors which serve as injectors are used instead of the above-mentioned large load resistors, and, moreover, no isolation between transistors within a row is required. As a result, high integration density and low manufacturing cost can be attained. It should be noted that such an I²L memory device can be manufactured by using conventional bipolar technology.

Usually, one I²L memory cell comprises first and second transistors of a first conduction type (such as a pnp) which serve as injectors, cross-coupled third and fourth transistors of a second conduction type (such as npn) which serve as a flip-flop, and fifth and sixth transistors of the second conduction type for detecting or reversing the state of the flip-flop, in the read or write mode respectively. The third and fourth transistors are always in the reverse conducting mode, in other words, the emitters and collectors of these transistors are used as collectors and emitters, respectively. In addition, when the memory cell is non-selected, the fifth and sixth transistors are also in the reverse conducting mode. Contrary to this, when the memory cell is selected, the fifth and sixth transistors are in the forward conducting mode.

In the above-mentioned I²L memory cell, one of the third and fourth transistors is conductive, while the other is non-conductive. If the third transistor is conductive, injection currents of the first and second transistors are supplied to the collector and base of the third transistor, respectively. In order to change the cell information, the third transistor must be made non-conductive. This is done by supplying an emitter current larger than a write threshold current $I_{wth}$, and thus bypassing the base current of the third transistor to the base of the fifth transistor. In this case, the write threshold current $I_{wth}$ depends on the total injection current $I_{inj}$ which flows through a common emitter of the first and second transistors. In other words, when the injection current $I_{inj}$ is large, the write threshold current $I_{wth}$ is large.

On the other hand, sink currents, which are explained below, flow from a selected memory cell to non-selected memory cells. The sink currents increase the injection current $I_{inj}$ of the selected memory cell and, accordingly, increase the write threshold current $I_{wth}$, so that the speed of the write operation becomes slow.

In order to decrease the sink currents flowing from a selected memory cell into non-selected memory cells, one conventional I²L memory device comprises a clamp circuit. The clamp circuit comprises a plurality of pairs of clamp transistors, each pair being connected to one pair of bit lines. In the write mode, a high voltage is applied to the bases of the clamp transistors, so that sink currents flow into non-selected memory cells from the clamp transistors. However, in the conventional device, there exists a problem in that it is difficult to determine the value of the high voltage to be applied to the clamp transistors, since the quantity of sink current flowing through a bit line depends on the states of the flip-flops of the memory cells and, in addition, when the value of the voltage is very high, the write current cannot flow from the selected memory cell to one of the selected bit lines. In addition, sink currents of non-selected memory cells which are not connected to a selected word line and selected bit line pair are supplied from the selected memory cell through half-selected memory cells which are connected to the selected word line, not to the selected bit line pair. As a result, the speed of the write operation is low and unstable.

SUMMARY OF THE INVENTION

It is a principal object of the present invention to provide a semiconductor integrated circuit device of an I²L type with high and stable write operation speed.

According to the present invention, there is provided a semiconductor integrated circuit device comprising: a plurality of word lines; a plurality of word drivers, each connected to one of the word lines; a plurality of hold lines; a plurality of pairs of bit lines; a plurality of bit drivers, each connected to one of the pairs of bit lines; a plurality of memory cells of integrated injection logic, each connected to one of the word lines, to one of the hold lines and to one pair of bit lines; and, a first clamp means for selectively altering the potentials of a first bit line of each pair from that of the second bit line of the same pair, in response to a write enable signal and an input data signal. In this device, it is preferable that, for example, the potentials of the first bit lines be as low as possible so as to increase the write current of a selected memory cell, while it is also preferable that the potentials of the second bit lines be as high as possible, so that sink currents of non-selected memory cells which are connected to a selected bit line pair are completely supplied from the first clamp means, not from the selected memory cell. Therefore, the speed of the write operation is high and stable.

According to the present invention, there is also provided a semiconductor integrated circuit device comprising: a plurality of word lines; a plurality of word drivers, each connected to one of the word lines; a plurality of hold lines; a plurality of pairs of bit lines; a plurality of bit drivers, each connected to one pair of bit lines; a plurality of memory cells of integrated injection logic, each connected to one of the word lines, to one of the hold lines and to one pair of bit lines; and a second clamp means for altering the potentials of a selected pair of bit lines from those of the other non-selected ones, the selected pair being selected by the bit drivers. In this device, it is preferable that the potentials of the selected bit lines be as low as possible so as to increase the write current of a selected memory cell, while it is preferable that the potentials of the non-selected bit lines be as high as possible, so that sink currents of non-selected memory cells which are not connected to a selected word line and selected bit line pair are completely supplied from the second clamp circuit. Therefore, the speed of write operation is high and stable.

BRIEF DESCRIPTION OF THE DRAWING

The present invention will be more clearly understood from the following description with reference to the accompanying drawings, wherein:

FIGS. 8, 8A and 8B are a circuit diagram illustrating an embodiment of the I$^2$L memory device according to the present invention.

DESCRIPTION OF THE PREFERRED EMBODIMENTS

Figure 1:
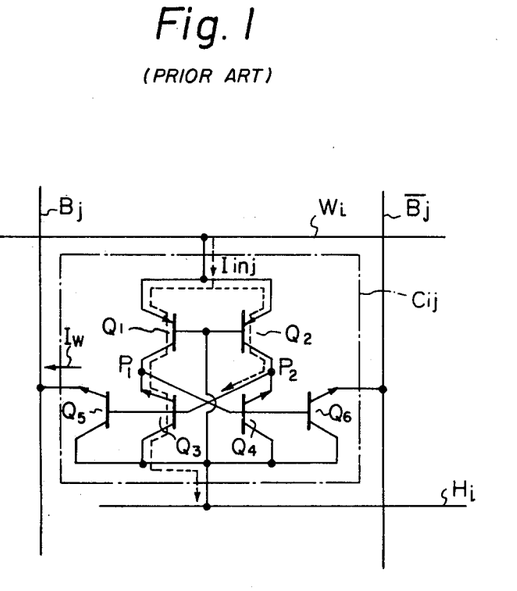
FIG. 1 is a circuit diagram illustrating an equivalent circuit of one I$^2$L memory cell.

Referring to FIG. 1, which illustrates an equivalent circuit of one I$^2$L memory cell, a memory cell $C_{ij}$ comprises a pair of pnp transistors $Q_1$ and $Q_2$ which serve as injectors, a pair of npn transistors $Q_3$ and $Q_4$ which are cross-coupled to each other and serve as a flip-flop, and a pair of npn transistors $Q_5$ and $Q_6$ for detecting or reversing the state of the flip-flop, in the read or write mode respectively. The transistors $Q_1$ and $Q_2$ have a common emitter connected to a word line $W_i$ and collectors connected to collectors (which are represented as emitters in FIG. 1) of the transistors $Q_3$ and $Q_4$, respectively. The bases of the transistors $Q_1$ and $Q_2$, the emitters of the transistors $Q_3$ and $Q_4$, and the collectors of the transistors $Q_5$ and $Q_6$ are connected to a common hold line $H_i$. In addition, the emitters of the transistors $Q_5$ and $Q_6$ are connected to bit lines $B_j$ and $\bar{B}_j$, respectively.

The selection of the memory cell $C_{ij}$ is effected by raising the potential of the word line $W_i$ and by connecting the bit lines $B_j$ and $\bar{B}_j$ to data bit lines (not shown), to which current sources (not shown) are connected. The transistors $Q_3$ and $Q_4$ are in the reverse conducting mode, regardless of the selected or non-selected state of the memory cell $C_{ij}$. Contrary to this, the transistors $Q_5$ and $Q_6$ are in the forward conducting mode during the selected state of the memory cell $C_{ij}$, while the transistors $Q_5$ and $Q_6$ are in the reverse conducting mode during the non-selected state of the memory cell $C_{ij}$.

In FIG. 1, the transistors $Q_3$ and $Q_4$ are placed in the on and off state alternately. For example, when the transistor $Q_3$ is conductive, an injection current $I_{inj}$ is supplied to the transistor $Q_3$ as a base current and a collector current through the transistors $Q_2$ and $Q_1$, respectively. As a result, the transistor $Q_3$ is in a saturated state, so that the potential at $P_1$ is low and, accordingly, the transistor $Q_4$ is non-conductive. In order to change the information stored in the memory cell $C_{ij}$, the transistor $Q_3$ should be changed from conductive to non-conductive. This is done by supplying a write current $I_W$ larger than a write threshold current $I_{wth}$ to the emitter of the transistor $Q_5$, so that the base of the transistor $Q_5$ absorbs the base current of the transistor $Q_3$. As a result, the transistor $Q_3$ is changed from a saturated state to a non-saturated state, so that the potential at $P_1$ becomes high. Therefore, the transistor $Q_4$ becomes conductive and the potential at $P_2$ becomes low, so that the transistor $Q_3$ becomes non-conductive. That is, the state of the flip-flop formed by the transistors $Q_3$ and $Q_4$ is reversed.

In the above-mentioned write mode, the write threshold current $I_{wth}$ depends on the injection current $I_{inj}$. Therefore, the write threshold current $I_{wth}$ is large where the injection current $I_{inj}$ is large.

Figure 2:
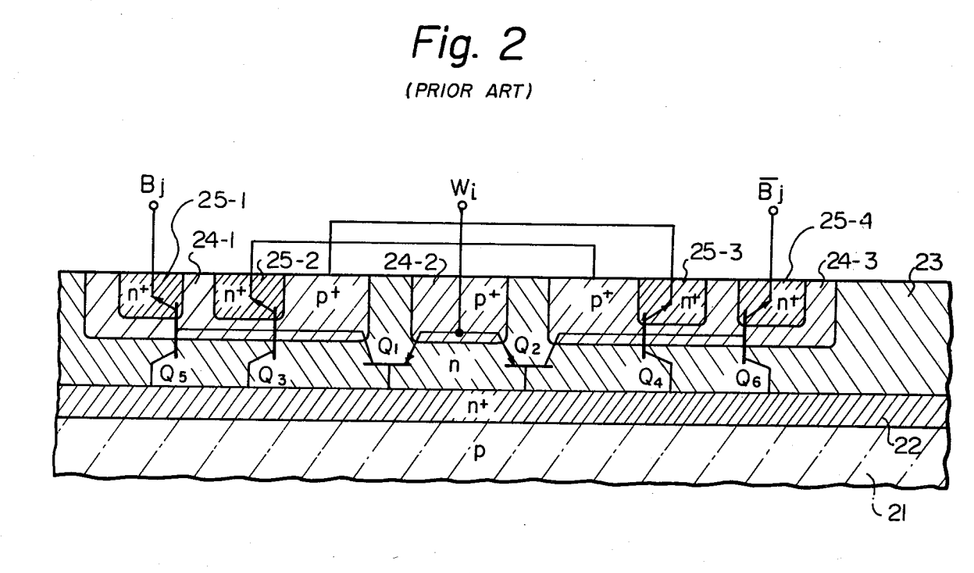
FIG. 2 is a cross-sectional view of the I$^2$L memory cell of FIG. 1.

FIG. 2 is a cross-sectional view of the I$^2$L memory cell of FIG. 1. In FIG. 2, an n$^+$-type buried layer 22, which serves as the hold line $H_i$ (FIG. 1), is formed in a p-type substrate 21 by using conventional diffusion technology. In addition, an n-type epitaxial layer 23 is formed on the buried layer 22 by using epitaxial technology. Further, in the epitaxial layer 23, p$^+$-type diffusion layers 24-1, 24-2, and 24-3 are formed, and, in addition, in the p$^+$-type diffusion layers 24-1 and 24-3, n$^+$-type diffusion layers 25-1, 25-2, 25-3, and 25-4 are formed by using conventional diffusion technology. As illustrated in FIG. 2, the injection transistors $Q_1$ and $Q_2$ are of a lateral type, while the transistors $Q_3$ and $Q_5$ (like $Q_4$ and $Q_6$) are both formed by one vertical transistor with multiple collectors (shown as emitters). In the memory cell of FIG. 2, it should be noted that there is no resistor of high resistance and no isolation between the transistors $Q_1$ through $Q_6$, so that the memory cells can be formed in a high density.

Next, sink currents flowing into non-selected memory cells will be explained.

Figure 3:
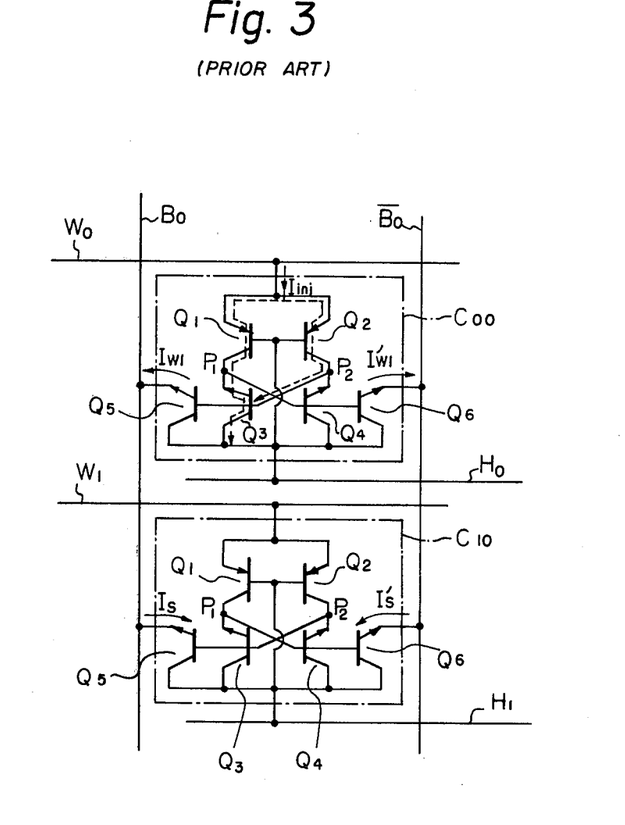
FIG. 3 is a circuit diagram of two I$^2$L memory cells like that of FIG. 1.

FIG. 3 is a circuit diagram of two I$^2$L memory cells of FIG. 1 which are arranged in one column. In FIG. 3, when memory cells $C_{00}$ and $C_{10}$ are selected and non-selected, respectively, in other words, when the potentials of word lines $W_0$ and $W_1$ are high and low, respectively, the potentials of hold lines $H_0$ and $H_1$ are high and low, respectively. In addition, when the transistors $Q_3$ of both of the cells $C_{00}$ and $C_{10}$ are conductive, the transistors $Q_5$ of both of the cells $C_{00}$ and $C_{10}$ are conductive. In this case, the transistor $Q_5$ of the cell $C_{00}$ is in the forward conducting mode, while the transistor $Q_5$ of the cell $C_{10}$ is in the reverse conducting mode. Therefore, a current $I_{W1}$ which is a part of an injection current $I_{inj}$ flows from the transistor $Q_5$ of the cell $C_{00}$ to a bit line $B_0$, while a sink current $I_S$ flows from the bit line $B_0$ through the transistor $Q_5$ of the cell $C_{10}$ to the hold line $H_1$. If the current $I_{W1}$ serves as a write current, the sink current $I_S$ increases the current $I_W$ so that the speed of write operation becomes high.

However when the non-selected cell $C_{10}$ has transistors $Q_5$ and $Q_6$ non-conductive and conductive respectively, a sink current $I_S'$ flows from a bit line $\bar{B}_0$ through the transistor $Q_6$ of the cell $C_{10}$ to the hold line $H_1$. In this case, the transistor $Q_6$ of the cell $C_{00}$ is in the forward conducting mode, and therefore, a current $I_{W1}'$ flows from the transistor $Q_6$ to a bit line $\bar{B}_0$, while a write current $I_W$ is sinked from the transistor $Q_5$ of the cell $C_{00}$, so that the injection current $I_{inj}$ of the cell $C_{00}$ is increased. As a result, the write threshold current $I_{wth}$, which depends on the injection current $I_{inj}$, is also increased, and therefore, the speed of the write operation becomes slow.

Figure 4A:
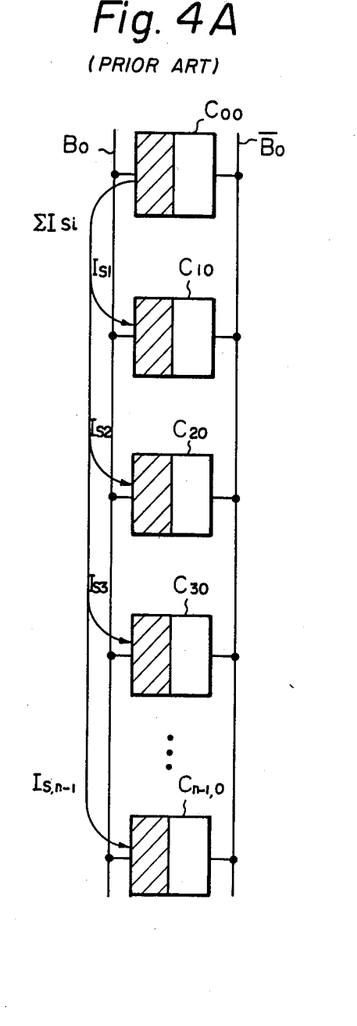
FIGS. 4A and 4B are block diagrams of n I$^2$L memory cells like that of FIG. 1.
Figure 4B:
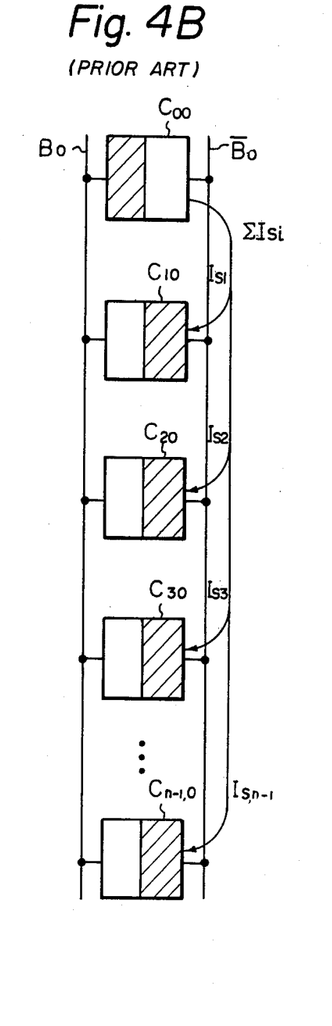

FIGS. 4A and 4B are block diagrams of n I²L memory cells like that of FIG. 1 which are arranged in one column. In FIGS. 4A and 4B, in a memory cell wherein the left-half portion thereof is shaded, the transistors $Q_3$ and $Q_4$ (FIG. 1) are conductive and non-conductive, respectively. Contrary to this, in a memory cell wherein the right-half portion thereof is shaded, the transistors $Q_3$ and $Q_4$ are non-conductive and conductive, respectively. In FIGS. 4A and 4B, the memory cell $C_{00}$ is selected and the others are non-selected.

As illustrated in FIG. 4A, a total sink current $\Sigma I_{si}$ flows into the selected memory cell $C_{00}$, that is, into the on-state side transistor $Q_5$ (FIG. 1) thereof, so that the total sink current is added to a write current for the selected $C_{00}$ and, accordingly, the speed of write operation becomes high. Contrary to this, in FIG. 4B, a total sink current $\Sigma I_{si}$ flows into the selected memory cell $C_{00}$, that is, into the off-state side transistor $Q_6$ (FIG. 1) thereof, so that the injection current of the selected memory cell $C_{00}$ is increased and, accordingly, the write threshold current is increased. As a result, the speed of write operation is decreased, if the write current is retained at a predetermined level. Thus, the speed of write operation for a selected memory cell depends on the states of the flip-flops of non-selected memory cells.

Figure 5:
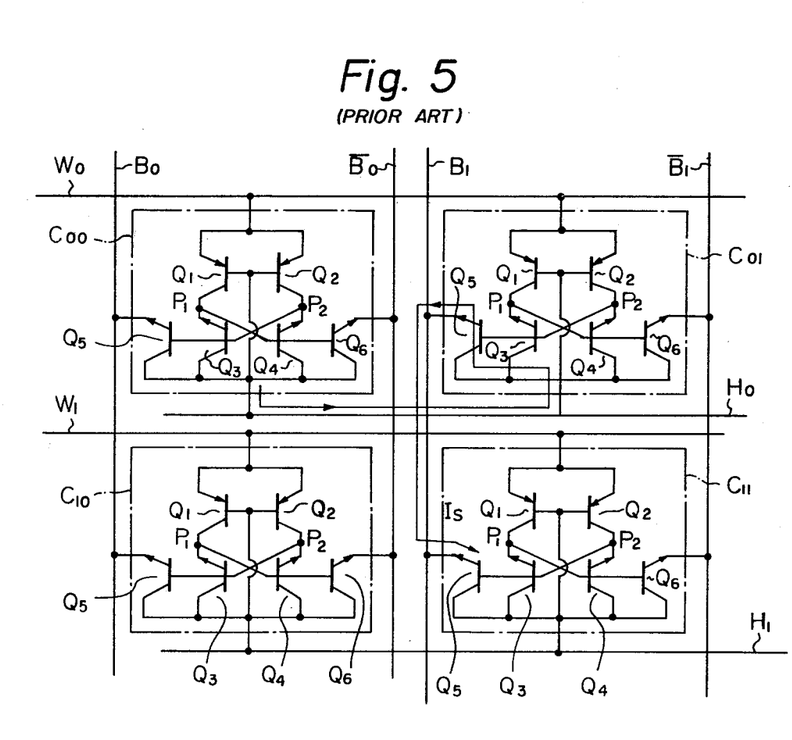
FIG. 5 is a circuit diagram of four I$^2$L memory cells like that of FIG. 1.

FIG. 5 is a circuit diagram of four I²L memory cells like that of FIG. 1, which are arranged in a 2 row by 2 column matrix form. In FIG. 5, only one memory cell $C_{00}$ is selected, while the others are non-selected. However, in this case, the potential of a word line $W_0$ to which the non-selected memory cell $C_{01}$ belongs is high, even through bit lines $B_1$ and $\overline{B}_1$ are not selected, i.e. no write current flows through the bit lines $B_1$ and $\overline{B}_1$. Such a non-selected memory cell $C_{01}$ connected to the high potential word line is referred to as a half-selected memory cell. If the transistor $Q_5$ of the non-selected memory cell $C_{11}$ is conductive, the transistors $Q_5$ of the memory cells $C_{01}$ and $C_{11}$ are in the forward and reverse conducting modes, respectively, since the potential of the hold line $H_0$ is higher than that of the hold line $H_1$. Therefore, a sink current $I_S$ flows into the transistor $Q_5$ of the non-selected memory cell $C_{11}$. As illustrated in FIG. 5, the sink current $I_S$ is supplied from the selected cell $C_{00}$, through the half-selected cell $C_{01}$, to the non-selected cell $C_{11}$. Each such contribution to sink current through a half-selected memory cell is small, but usually there are a large number of non-selected memory cells in a memory device. For example, in a 1024 bit (32 rows, 32 columns) memory device, there are $(32-1)^2$ of non-selected memory cells. Therefore, the total sink current through half-selected memory cells is large, which also increases the injection current $I_{inj}$ of a selected memory cell.

Figures 6, 6A:
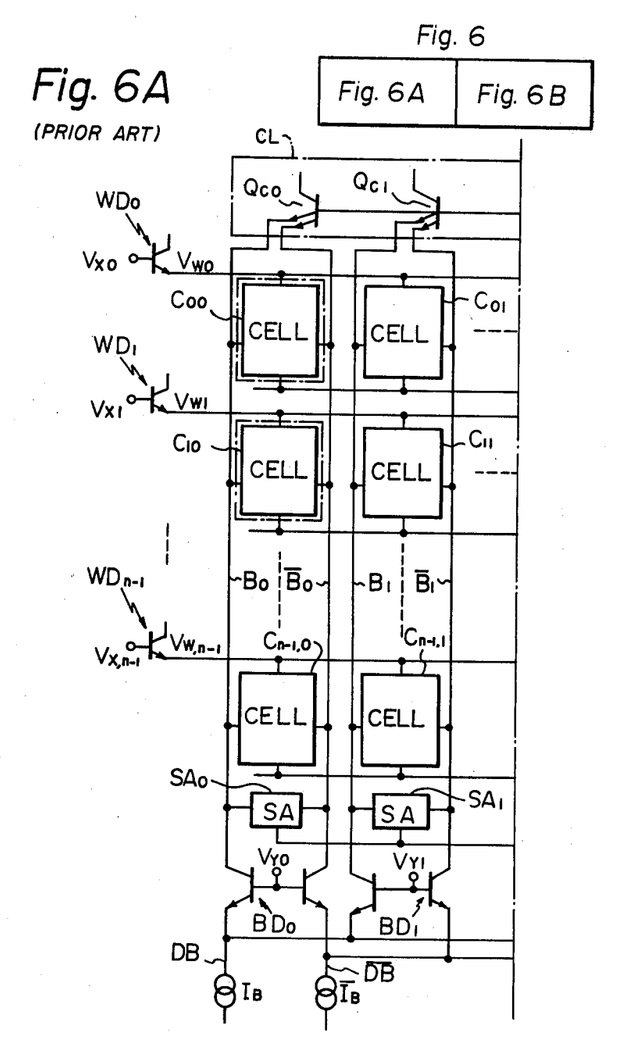
FIGS. 6, 6A and 6B are a block diagram illustrating a conventional I$^2$L memory device.
Figure 6B:
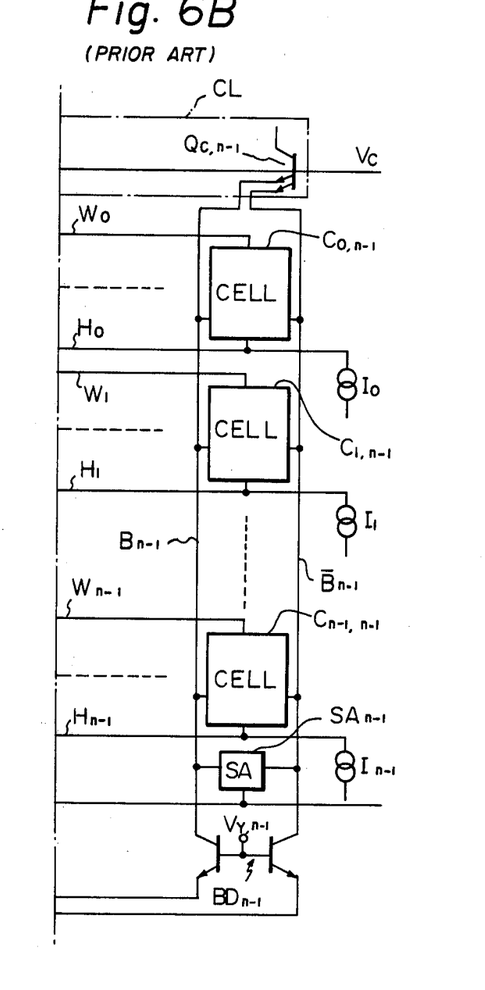

FIG. 6 is a block diagram illustrating a conventional I²L memory device. FIG. 6 shows a memory array which is comprised of memory cells $C_{ij}$ (i, j = 0, 1, ..., n−1) arranged in an n row by n column matrix. Each of the memory cells $C_{ij}$ can be selected by supplying row selection signals $V_{X0}$ through $V_{X,n-1}$ to word decoders $WD_0$ through $WD_{n-1}$ and by supplying column selection signals $V_{Y0}$ through $V_{Y,n-1}$ to bit drivers $BD_0$ through $BD_{n-1}$. Sense amplifiers indicated by the reference characters $SA_0, ..., SA_{n-1}$ detect the data stored in the memory cells.

In the above-mentioned device, a clamp circuit CL is provided so as to supply sink currents into non-selected memory cells. Therefore, an injection current in a selected memory cell can be stable. For example, when the potentials of only the signals $V_{X0}$ and $V_{Y0}$ are high, the memory cell $C_{00}$ is selected and the memory cells $C_{01}, C_{02}, ..., C_{0,n-1}$, which belong to the word line $W_0$, are half-selected. In addition, the other memory cells are non-selected. A clamp voltage $V_C$ provided at the clamp circuit CL should be determined between two values which will now be explained.

Figure 7:
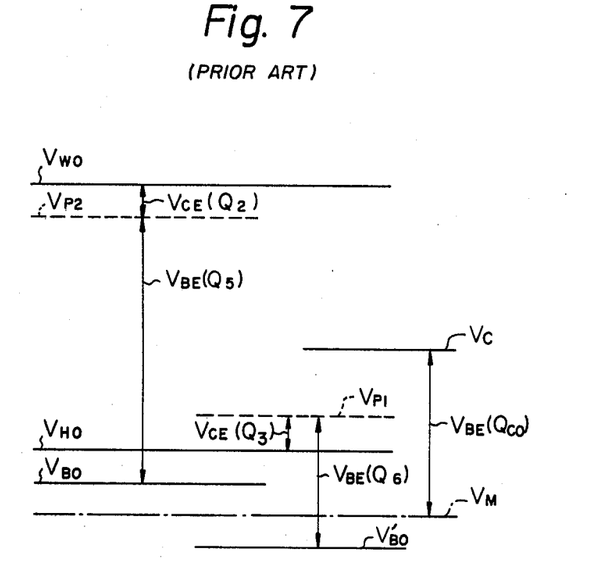
FIG. 7 is a diagram showing potential levels for explaining the value of the clamp voltage $V_C$ of the clamp circuit CL of FIG. 6.

FIG. 7 is a diagram showing potential levels, for explaining the value at the clamp voltage $V_C$ of the clamp circuit CL of FIG. 6. In FIG. 7, $V_{W0}$ and $V_{H0}$ indicate the potentials of the word line $W_0$ and the hold line $H_0$, and $V_{P1}$ and $V_{P2}$ indicate the potentials at $P_1$ and $P_2$ (see FIG. 1) respectively, within the memory cell $C_{00}$. These potentials are represented as follows.

$$V_{P1} = V_{H0} + V_{CE}(Q_3)$$

$$V_{P2} = V_{W0} - V_{CE}(Q_2)$$

where $V_{CE}(Q_5)$ and $V_{CE}(Q_2)$ are collector-emitter voltages of the transistors $Q_5$ and $Q_2$ (FIG. 1), respectively. In this case, the transistors $Q_3$ and $Q_4$ (FIG. 1) of the cell $C_{00}$ are conductive and non-conductive, respectively.

In addition, the potential $V_{B0}$ of the bit line $B_0$ should satisfy the following formula, so that the write current $I_W$ can flow from the transistor $Q_5$ (FIG. 1) into the bit line $B_0$.

$$V_{B0}' \geq V_{P1} - V_{BE}(Q_6)$$

where $V_{BE}(Q_5)$ is a base-emitter voltage of the transistor $Q_5$.

On the other hand, the potential $V_{B0}'$ of the bit line $\overline{B}_0$ should satisfy the following formula, so that no sink current can flow from the transistor $Q_6$ (FIG. 1) of the selected cell $C_{00}$ to non-selected memory cells.

$$V'_{B0} = V_{P1} - V_{BE}(Q_6)$$

where $V_{BE}(Q_6)$ is a base-emitter voltage of the transistor $Q_6$.

Therefore, for example, the clamp voltage $V_C$ is caused to be $V_M + V_{BE}(Q_{C0})$, where $V_M$ is $(V_{B0} - V'_{B0})/2$ and $V_{BE}$ is a base-emitter voltage of the transistor $Q_{C0}$ of the clamp circuit CL. Thus, a large write current can flow from the selected memory cell and, in addition, sink currents are supplied to the non-selected memory cells from the clamp circuit CL, not from the selected memory cell. However, since the potential $V_{BE}(Q_5)$ or $V_{BE}(Q_6)$ depends on whether or not a write current flows through the transistor $Q_5$ or $Q_6$, so that (e.g.) the potential $V_{BE}(Q_5)$ is larger than the potential $V_{BE}(Q_6)$, the difference between the potentials $V_{B0}$ and $V'_{B0}$ is small, and accordingly it is difficult to determine the clamp voltage $V_C$ at an appropriate level. As a result, the variation of speed of the write operation may be large. In addition, it is difficult to reduce the increase of the injection current of the selected memory cell due to the presence of sink currents through the half-selected memory cells.

In the present invention, the potential of the one bit line of a selected bit line pair, through which a write current flows, is clamped as low as possible, while the potential of the other of the selected bit line pair, through which a write current does not flow, is clamped as high as possible, so that sink currents into other non-selected memory cells connected to the selected bit line pair are not supplied from the selected memory cell. In addition, the potentials of both bit lines of non-selected bit pairs are clamped as high as possible, so that sink currents towards non-selected memory cells connected to the non-selected bit pairs are not supplied from the selected memory cell.

Figure 8A:
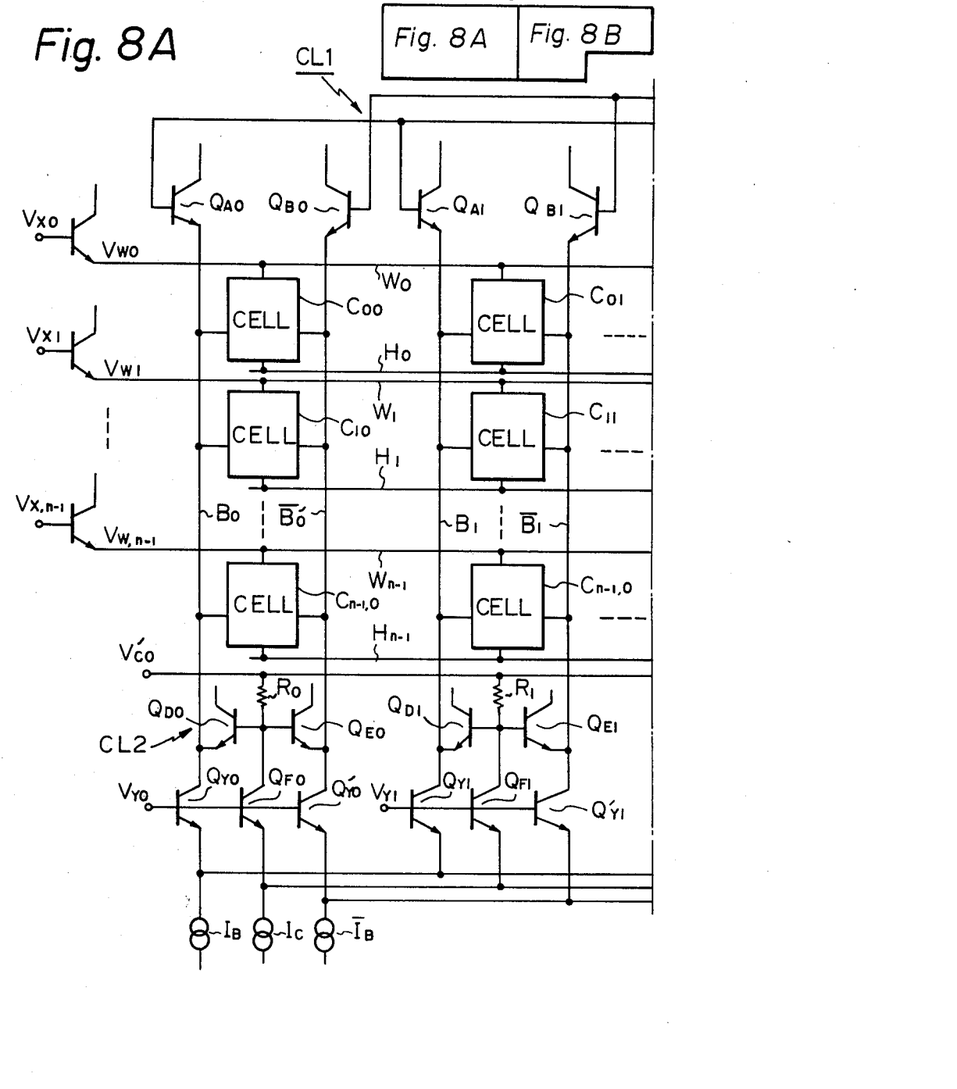
Figure 8B:
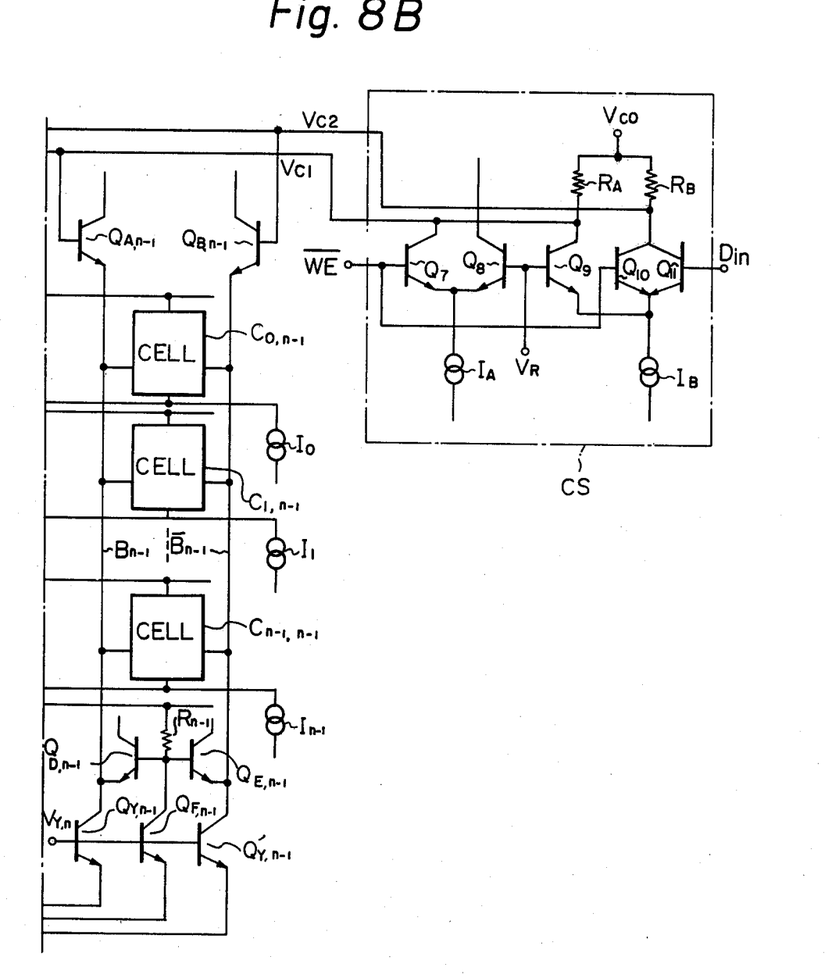

FIG. 8 is a circuit diagram illustrating an embodiment of the I$^2$L memory device according to the present invention. The elements illustrated in FIG. 8 which are identical to those of FIG. 6 are denoted by the same reference numerals. In FIG. 8, a clamp circuit CL1, a current switching circuit CS for controlling the clamp circuit CL1, and another clamp circuit CL2 are provided. In addition, the potentials of selection signals $V_{X0}$ and $V_{Y0}$ are high and the potentials of the other selection signals are low, so that memory cell $C_{00}$ is selected, and memory cells $C_{01}$ through $C_{0,n-1}$ are half-selected and the other memory cells are non-selected.

Figure 9:
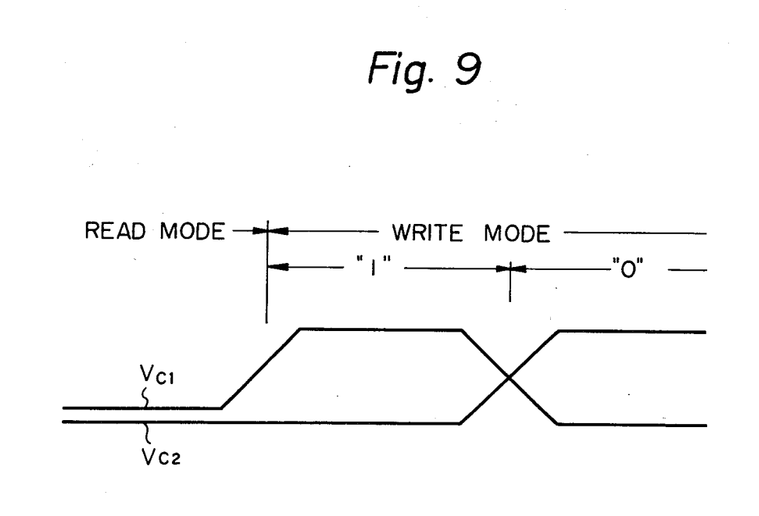
FIG. 9 is a timing diagram of the signals $V_{C1}$ and $V_{C2}$ of FIG. 8.

The clamp circuit CL1 and the current switching circuit CS of FIG. 8 will now be explained in more detail. The clamp circuit CL1 comprises transistor pairs $Q_{A0}, Q_{B0}; Q_{A1}, Q_{B1}; \ldots; Q_{A,n-1}, Q_{B,n-1}$, connected to the pairs of bit lines $B_0, \overline{B}_0; B_1, \overline{B}_1; \ldots; B_{n-1}, \overline{B}_n$, respectively. The voltage $V_{C1}$ of the bases of the transistors $Q_{A0}, Q_{A1}, \ldots, Q_{A,n-1}$ and the voltage $V_{C2}$ of the bases of the transistors $Q_{B0}, Q_{B1}, \ldots, Q_{B,n-1}$ are controlled by the current switching circuit CS. In the current switching circuit CS, transistors $Q_7$ and $Q_8$ form a current switch controlled by an inverted write enable signal $\overline{WE}$ and a reference voltage $V_R$, while transistors $Q_9, Q_{10}$ and $Q_{11}$ form another current switch controlled by the reference voltage $V_R$, the signal $\overline{WE}$, and an input data signal $D_{in}$. During the read mode, in which the potential of the signal $\overline{WE}$ is higher than the reference voltage $V_R$, the transistors $Q_7$ and $Q_{10}$ are conductive and the others are non-conductive, so that currents $I_A$ and $I_B$ respectively flow through resistors $R_A$ and $R_B$, which are connected to a line whose potential is $V_{C0}$. As a result, the clamp voltages $V_{C1}$ and $C_{C2}$ are both low, as illustrated in FIG. 9.

In a write mode in which the potentials of the signals $\overline{WE}$ and $D_{in}$ are respectively lower and higher than the reference voltage $V_R$, the transistors $Q_8$ and $Q_{11}$ are conductive and the others are non-conductive, so that the current $I_A$ flows through the transistor $Q_8$, not through the resistor $R_A$, and the current $I_B$ flows through the resistor $R_B$. As a result, the clamp voltages $V_{C1}$ and $V_{C2}$ are high and low, respectively, as illustrated in FIG. 9.

Contrary to above, in another write mode in which the potentials $\overline{WE}$ and $D_{in}$ are both lower than the reference voltage $V_R$, the transistors $Q_8$ and $Q_9$ are conductive and the others are non-conductive, so that the currents $I_A$ and $I_B$ respectively flow through the transistors $Q_8$ and $Q_9$ rather than through the resistors $R_A$ and $R_B$. As a result, the clamp voltages $V_{C1}$ and $V_{C2}$ are low and high, respectively, as illustrated in FIG. 9.

It should be noted that the difference between the voltages $V_{c1}$ and $V_{c2}$ can be increased by raising the potential $V_{C0}$ of the circuit CS, and the values of the resistors $R_A$ and $R_B$. Therefore, the write current can be increased, since the current is not limited by the off-state clamp transistor, such as $Q_{A0}$ at the bit line $B_0$. In addition, sink currents of non-selected memory cells which are connected to selected bit line $B_0$ are completely supplied from the on-state clamp transistor $Q_{A1}$, in other words, no sink current flows from the off-state transistor of the selected memory cell $C_{00}$.

Next, the clamp circuit CL2 of FIG. 8 will be explained in more detail. The clamp circuit CL2 comprises pairs of transistors $Q_{D0}, Q_{E0}; Q_{D1}, Q_{E1}; \ldots; Q_{D,n-1}, Q_{E,n-1}$, connected to bit lines $B_0, \overline{B}_0; B_1, \overline{B}_1; \ldots; B_{n-1}, \overline{B}_{n-1}$, respectively. The bases of the transistors $Q_{D0}, Q_{E0}; Q_{D1}, Q_{E1}; \ldots; Q_{D,n-1}, Q_{E,n-1}$ are respectively connected to resistors $R_0, R_1, \ldots, R_{n-1}$ which are connected to a line whose potential is $V_{C0}'$, and to driving transistors $Q_{F0}, Q_{F2}, \ldots, Q_{F,n-1}$. The driving transistors, which are associated with transistors $Q_{Y0}, Q_{Y0}'; Q_{Y1}, Q_{Y1}'; \ldots; Q_{Y,n-1}, Q'_{Y,n-1}$, which form bit drivers, are controlled by column selection signals $V_{Y0}, V_{Y1}, \ldots, V_{Y,n-1}$. When the potential of the signal $V_{Y0}$ is high and the others are low, a current $I_C$ flows through the resistor $R_0$ and the transistor $Q_{F0}$, so that the potential of the bases of the transistors $Q_{D0}$ and $Q_{E0}$ are low, and the base potentials of the transistors $Q_{D1}, Q_{E1}, Q_{D2}, Q_{E2}, \ldots, Q_{D,n-1}, Q_{E,n-1}$ are high. As a result, the potentials of the bit lines $B_0$ and $\overline{B}_0$ are low, and the potentials of the other bit lines are high. Therefore, sink currents of non-selected memory cells which are not connected to the selected word line $W_0$ and to the selected bit lines $B_0$ and $\overline{B}_0$ are supplied from the transistors $Q_{D1}, Q_{E1}, Q_{D2}, Q_{E2}, \ldots, Q_{D,n-1}, Q_{E,n-}$. Of course, some of the sink currents are supplied from the clamp circuit CL1. However, in a selected column, the potential of one of the bit lines $B_0$ and $\overline{B}_0$ is caused to be high by the transistor $Q_{A0}$ or $Q_{B0}$ of the clamp circuit CL1.

As explained above, the semiconductor integrated circuit device according to the present invention has the advantage that the speed of write operation is high and stable, since sink currents of non-selected memory cells are completely supplied from the clamp circuits and, in addition, no current is supplied from the clamp circuits to a selected bit line through which a write current flows.

What is claimed is:

1. A semiconductor integrated circuit device comprising:
   a plurality of word lines;
   a plurality of word drivers, each connected to one of said word lines;
   a plurality of hold lines;
   a plurality of pairs of bit lines, each bit line having a variable potential and each bit line pair selectively conducting an associated current including a sink current;
   a plurality of bit drivers, each connected to a corresponding pair of said bit lines;
   a plurality of memory cells of integrated injection logic, each connected to a corresponding one of said word lines, to a corresponding one of said hold lines and to a corresponding pair of said bit lines,
   each memory cell including:
   injectors comprising first and second transistors of a first conduction type which have a common emitter connected to said corresponding one of said word lines;
   a flip-flop comprising cross-coupled third and fourth transistors of a second conduction type, connected to said first and second transistors respectively, and an emitter connected to the corresponding pair of said bit lines;

fifth and sixth transistors of a second conduction type, each comprising a base and a collector both connected in parallel with said third or fourth transistor, respectively and an emitter connected to the corresponding pair of said bit lines;

said third, fourth, fifth and sixth transistors being connected to the corresponding one of said hold lines; and first clamp means for selectively raising the potential of a first bit line of each of said pairs of bit lines above that of the second bit line of each of said pairs of bit lines in response to a write enable signal and an input data signal, and for absorbing the sink current associated with each of said first bit lines.

2. A device according to claim 1, further comprising second clamp means for raising the potentials of non-selected pairs of bit lines from that of a selected pair, and for absorbing the sink current associated with said non-selected pairs of bit lines, said selected pair being selected by said bit drivers.

3. A device according to claim 1 or 2, wherein said first clamp means comprises:

a plurality of pairs of first clamp transistors, each said pair being connected to a corresponding one of said pairs of bit lines; and current switching means for selectively clamping the bases of said first clamp transistors in response to said write enable signal and said input data signal.

4. A device according to claim 3, wherein said current switching means comprises:

a first current switch comprising seventh and eighth transistors controlled by said write enable signal and by a reference voltage, respectively;

a second current switch comprising ninth, tenth and eleventh transistors controlled by said reference voltage, by said write enable signal, and by said input data signal, respectively;

first and second current sources for supplying currents to said first and second current switches;

a first resistor connected to said seventh and ninth transistors; and a second resistor connected to said tenth and eleventh transistors.

5. A semiconductor integrated circuit device comprising:

a plurality of word lines;

a plurality of word drivers, each connected to one of said word lines;

a plurality of hold lines;

a plurality of pairs of bit lines, each bit line having a variable potential and each bit line pair selectively conducting an associated current including a sink current;

a plurality of bit drivers, each connected to a corresponding pair of said bit lines;

a plurality of memory cells of integrated injection logic, each connected to a corresponding one of said word lines, to a corresponding one of said hold lines and to a corresponding pair of said bit lines, each memory cell including:

injectors comprising first and second transistors of a first conduction type which have a common emitter connected to said corresponding one of said word lines;

a flip-flop comprising cross-coupled third and fourth transistors of a second conduction type, connected to said first and second transistors respectively, and an emitter connected to the corresponding pair of said bit lines;

fifth and sixth transistors of a second conduction type, each comprising a base and a collector both connected in parallel with said third or fourth transistor, respectively, and an emitter connected to the corresponding pair of said bit lines;

said third, fourth, fifth and sixth transistors being connected to the corresponding one of said hold lines; and clamp means for raising the potentials of non-selected pairs of said bit lines from that of a selected pair, and for absorbing the sink current associated with said non-selected pairs of bit lines, said selected pair being selected by said bit drivers.

6. A device according to claim 5 or 2, wherein said clamp means for raising the potentials of non-selected pairs of bit lines comprises:

a plurality of pairs of second clamp transistors, each connected to a corresponding one of said pairs of bit lines;

a plurality of resistors, each connected to the bases of one pair of said pairs of second clamp transistors;

a plurality of driving transistors, each connected to one of said resistors and to one of said bit drivers; and a plurality of current sources, each supplying a current to one of said driving transistors.

* * * * *

UNITED STATES PATENT AND TRADEMARK OFFICE
CERTIFICATE OF CORRECTION

PATENT NO. : 4,398,268          Page 1 of 2
DATED      : AUGUST 9, 1983
INVENTOR(S) : KAZUHIRO TOYODA It is certified that error appears in the above-identified patent and that said Letters Patent is hereby corrected as shown below:

Front page, OTHER PUBLICATIONS,
    line 2, "Bull." should be --Bul.--;

Col. 3, line 8, change "DRAWING" to --DRAWINGS--;

line 28, "are a circuit diagram" should be --are circuit diagrams--.

Col. 4, line 66, "$I_{W1}$," should be --$I_{W'1}$--.
Col. 5, line 38, "through" should be --though--.
Col. 6, line 15, "of" should be --at--;

line 35, "$V_{BO'} \gtreqless V_{P1} - V_{BE}(Q6)$" should be --$V_{BO} \leq V_{P2} - V_{BE}(Q5)$--;

line 39, "$V_{BO'}$" should be --$V'_{BO}$--;

line 44, "$V'_{BO} = V_{P1} - V_{BE}(Q6)$" should be --$V_{BO'} \gtreqless V_{P1} - V_{BE}(Q6)$--.

UNITED STATES PATENT AND TRADEMARK OFFICE
CERTIFICATE OF CORRECTION

PATENT NO. : 4,398,268          Page 2 of 2
DATED : AUGUST 9, 1983
INVENTOR(S) : KAZUHIRO TOYODA It is certified that error appears in the above-identified patent and that said Letters Patent is hereby corrected as shown below:

Col. 7, line 34, "an inverted write enable" should be --an inverted signal $\overline{WE}$ of a write enable signal WE--;
       line 35, delete "signal $\overline{WE}$".
Col. 8, line 14, "$V_{CO}$," should be --$V'_{CO}$--;

line 17, "QY0'" should be --Q'Y0--;
       line 17, "QY1'" should be --Q'Y1--;
       line 30, "$Q_{E,n-}$." should be --$Q_{E,n-1}$.--.

Signed and Sealed this

Twenty-first Day of February 1984

[SEAL]

Attest:

GERALD J. MOSSINGHOFF

Attesting Officer     Commissioner of Patents and Trademarks